(12) United States Patent
Gilissen et al.

(10) Patent No.: US 8,411,247 B2
(45) Date of Patent: Apr. 2, 2013

(54) LITHOGRAPHIC APPARATUS AND POSITIONING APPARATUS

(75) Inventors: Noud Jan Gilissen, 's-Gravenzande (NL); Theodorus Petrus Maria Cadee, Vlierden (NL)

(73) Assignee: ASML Netherlands B.V., Veldhoven (NL)

( * ) Notice: Subject to any disclaimer, the term of this patent is extended or adjusted under 35 U.S.C. 154(b) by 657 days.

(21) Appl. No.: 12/618,832

(22) Filed: Nov. 16, 2009

(65) Prior Publication Data

US 2010/0141914 A1 Jun. 10, 2010

Related U.S. Application Data

(60) Provisional application No. 61/121,382, filed on Dec. 10, 2008.

(51) Int. Cl.
*G03B 27/52* (2006.01)
*G03B 27/58* (2006.01)
*G03B 27/62* (2006.01)

(52) U.S. Cl. .................. 355/30; 355/72; 355/75

(58) Field of Classification Search .......... 355/30, 355/72, 75
See application file for complete search history.

(56) References Cited

U.S. PATENT DOCUMENTS

| 6,954,258 B2 | 10/2005 | Emoto |
| 7,391,503 B2 | 6/2008 | Venema et al. |
| 7,649,611 B2 | 1/2010 | Zaal et al. |
| 7,864,298 B2 | 1/2011 | Sekine |
| 2007/0153244 A1 * | 7/2007 | Zaal et al. ............... 355/30 |
| 2008/0151202 A1 | 6/2008 | Ohishi |

FOREIGN PATENT DOCUMENTS

| CN | 1991591 | 7/2007 |
| JP | 5-203773 | 8/1993 |
| JP | 7-29831 | 6/1995 |
| JP | 2003-058258 | 2/2003 |
| JP | 2005-340719 | 12/2005 |
| JP | 2006-317316 | 11/2006 |
| JP | 2007-103941 | 4/2007 |
| JP | 2007-194618 | 8/2007 |
| JP | 2008-159677 | 7/2008 |
| TW | 2008-42506 | 11/2008 |

OTHER PUBLICATIONS

Japanese Office Action mailed Nov. 11, 2011 in corresponding Japanese Patent Application No. 2009-275031.

* cited by examiner

*Primary Examiner* — Peter B Kim
(74) *Attorney, Agent, or Firm* — Pillsbury Winthrop Shaw Pittman LLP

(57) ABSTRACT

A lithographic apparatus includes a movable first object, and a heat exchanger including a heat exchanging body, the heat exchanging body including a material with electro-caloric or magneto-caloric properties and configured to affect the temperature of the first object by exchanging heat with the movable first object, and a generator configured to supply an electromagnetic field to the heat exchanging body to change the temperature of the heat exchanging body in order to cool or heat the first object.

15 Claims, 4 Drawing Sheets

LITHOGRAPHIC APPARATUS AND POSITIONING APPARATUS

CROSS REFERENCE TO RELATED APPLICATIONS

This application claims priority and benefit under 35 U.S.C. §119(e) to U.S. Provisional Patent Application No. 61/121,382, entitled "Lithographic Apparatus and Positioning Apparatus", filed on Dec. 10, 2008. The content of that application is incorporated herein in its entirety by reference.

FIELD

The present invention relates to a lithographic apparatus. The present invention further relates to a positioning apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Commonly, a lithographic apparatus includes a movable object. Such an object is movable with respect to another object, such as a frame, for instance a base frame or a metrology frame. An example of a movable object is a support structure of for instance the substrate or the patterning device, which may be movable to position the substrate and/or patterning device with respect to a radiation beam in a pattern transfer process, wherein a pattern is transferred from the patterning device to the substrate. Especially in scanners, both support structures are movable.

When an object is movable with respect to another object, cables and/or hoses may be provided between them to transfer power, data, fluids, etc. from one object to the other and vice versa. The movable object may include heat sources in the form of actuators which may position the movable object with respect to another object, or other heat sources. These heat sources may influence the temperature and/or temperature distribution of the movable object. When the movable object is used in the pattern transfer process of a lithographic apparatus the temperature is preferably controlled (possibly in the millikelvin range) in order to minimize imaging problems and/or overlay errors. In that case, the movable object may be temperature controlled by passing a fluid with a predetermined temperature through the movable object, wherein the fluid is transported in hoses to and from the movable object.

However, positioning cables and/or hoses between two relatively moving objects may limit the achievable position accuracy of the movable object(s), because the cables and/or hoses introduce force disturbances. In case of a fluid carrying hose, these force disturbances may be the result of inertia forces of the moving fluid itself and/or the interaction between the fluid and the acceleration or deceleration of the movable object. In combination with the tendency to decrease the mass of the movable objects and the increased demands with respect to accuracy and acceleration (>15 G), these disturbances become unacceptable and may result in imaging problems and/or overlay errors of the lithographic apparatus.

SUMMARY

It is desirable to provide a lithographic apparatus with reduced imaging problems and/or overlay errors. It is further desirable to improve the obtainable position accuracy of a temperature controlled movable object.

According to an embodiment of the invention, there is provided a lithographic apparatus including: a movable first object, and a heat exchanger including a heat exchanging body, the heat exchanging body including a material with electro-caloric or magneto-caloric properties and configured to affect the temperature of the first object by exchanging heat with the movable first object, and a generator configured to supply an electromagnetic field to the heat exchanging body to adapt the temperature of the heat exchanging body in order to cool or heat the first object.

According to another embodiment of the invention, there is provided a positioning apparatus to position a first object with respect to a second object, including a heat exchanger, the heat exchanger including a heat exchanging body, which includes a material with electro-caloric or magneto-caloric properties and is configured to exchange heat with the first object and the second object, and a generator configured to supply an electromagnetic field to the heat exchanging body to adapt the temperature of the heat exchanging body in order to cool or heat the first object, wherein the heat exchanging body is configured to exchange heat with the first object in a first position, and to exchange heat with the second object in a second position, the heat exchanger further including a positioning system configured to move at least a portion of the heat exchanging body between the first and second position.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
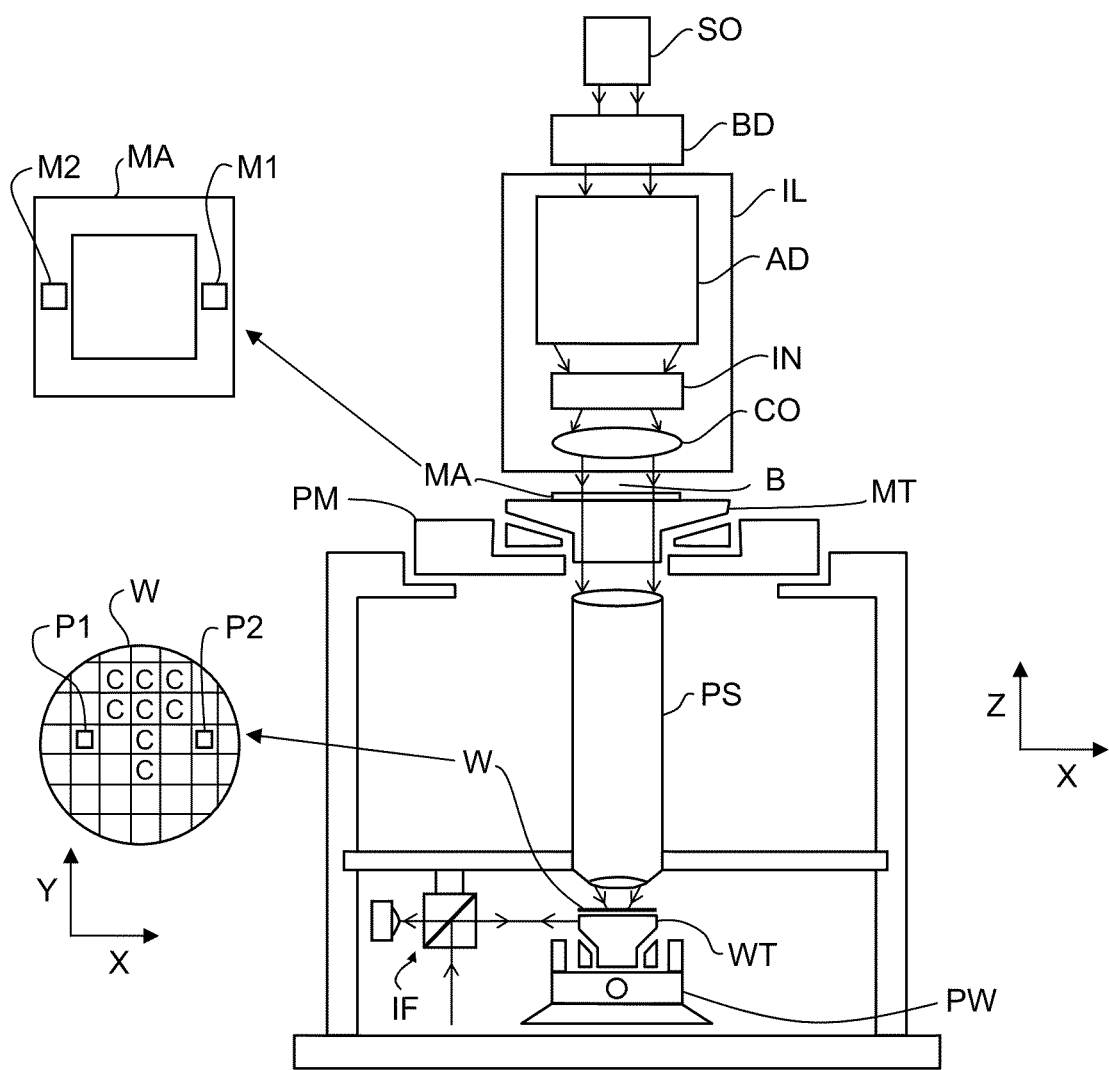
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
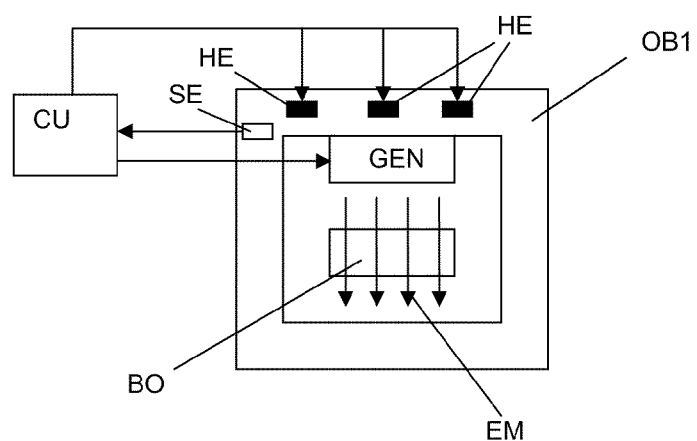
FIG. 2 depicts a schematic representation of an object, which can be temperature controlled by a heat exchanging assembly according to an embodiment of the invention.

FIG. 2 depicts a schematic representation of a movable first object OB1 which can be heated or cooled by a heat exchanging assembly (which can be broadly termed hear exchanger) according to an embodiment of the invention. The first object OB1 can be any movable object within a lithographic apparatus, such as for instance a substrate table or holder, a support constructed to support a patterning device, a long stroke-module, a short-stroke module, a mechanical part, an electric part, or an optical part. The first object can be a single component, but also an assembly, an element, a member, a system, a part, or portions thereof. The heat exchanging assembly includes a heat exchanging body BO and a generator GEN.

The heat exchanging body BO includes a material with electro-caloric or magneto-caloric properties. A material having electro-caloric properties shows a substantially reversible temperature change under an applied electric field. An example of such a material is a ceramic material which is a mixture of lead, titanium, oxygen, and zirconium. A material having magneto-caloric properties shows a substantially reversible temperature change under an applied magnetic field. An example of such a material is gadolinium. The temperature change may be a positive one or a negative one, depending on the material. It is also possible to combine two of these materials, for instance one material with an electro-caloric property and one material with a magneto-caloric property, wherein the temperature change due to an electric field of the electro-caloric material is opposite to the temperature change due to a magnetic field of the magneto-caloric material. This allows the heat exchanging body to increase or decrease its temperature with respect to an initial temperature, resulting in a larger temperature range in which the heat exchanging body can operate.

The generator GEN is able to supply an electromagnetic field EM to the heat exchanging body BO, in order to adapt the temperature of the heat exchanging body BO. When the generator GEN applies the electromagnetic field EM to the heat exchanging body BO, the temperature of the heat exchanging body BO will change with a value $\Delta T$. Removing the electromagnetic field EM in a later stage will change the temperature of the heat exchanging body BO with a value $-\Delta T$. Assuming that initially the heat exchanging body BO and the first object OB1 have the same temperature, the change in temperature of the heat exchanging body BO due to the electromagnetic field EM creates a temperature difference between the heat exchanging body BO and the first object OB1. It is noted that a temperature difference can also be created when the heat exchanging body BO and the first object OB1 do not initially have the same temperature. Due to the temperature difference, a net amount of heat will be transferred from or to the first object OB1, thereby cooling or heating the first object OB1, respectively.

A benefit of the heat exchanger of FIG. 2 is that no fluid connection with another object like a frame is required, thereby reducing the number of hoses that need to be provided to the first object OB1 compared to a heat exchanger using a transportable fluid. The reduction of the number of hoses results in a decrease of the force disturbances and will lead to an increased position accuracy compared to heat exchanging assemblies using a transportable fluid. If the movable object is used in a lithographic apparatus, for example the apparatus according to FIG. 1, the increased position accuracy results in an increased image quality and overlay performance.

Preferably, the use of a heat exchange assembly as described above results in the absence of hoses between the first object OB1 and another object, thereby eliminating the source of the force disturbances, which results in an even further improved performance.

It is to be understood that the schematic representation of FIG. 2 is not limited to the shown example. The generator GEN is attached to the first object OB1, but it can also be integral with the first object OB1 or be no part of the first object OB1 at all and be placed outside the first object OB1. The generator is able to provide the electromagnetic field EM to the heat exchanging body BO.

Furthermore, the heat exchanging body BO can be part of the first object OB1, but it can also be a separate identity. It is further possible that the heat exchanging body BO is not movable with respect to the first object OB1, and thus travels with the first object OB1, but it can also be stationary with respect to a frame and therefore be movable with respect to the first object OB1. In that case, it is possible that the heat exchanging body BO cools or heats the first object OB1 in a specific location, subsequently the first object OB1 moves away from the heat exchanging body BO to perform some duties and returns to the specific location if cooling or heating is required. In another variant, the heat exchanging body BO may be entirely surrounded by the first object OB1, so that the heat exchanging body BO can only exchange heat with the first object.

The generator GEN may be wirelessly operated and powered, which may be beneficial in case the generator GEN is a part of or attached to the first object OB1, because it further reduces the number of cables between the first object OB1 and another object.

In the variant wherein the heat exchanging body BO is not movable with respect to the first object OB1, the heat exchanging assembly is especially suitable to temperature control the first object OB1 for a limited period of time. In a lithographic apparatus, this limited period of time may be the time period wherein a pattern is transferred from a patterning device to a substrate, i.e. during a pattern transfer process. The temperature of the substrate and the patterning device, and in particular the temperature distribution, is an important parameter in obtaining maximum accuracy. Controlling the temperature of the first object OB1 in the time period within a small temperature range (preferably a millikelvin temperature range) is thus desirable.

Temperature control of the first object OB1 can be established by controlling the temperature of the heat exchanging body BO, which in turn is dependent on the strength of the electromagnetic field EM. An example of how the first object OB1 can be controlled by the heat exchanging assembly or heat exchanger will be explained below.

Assuming that the heat exchanging body BO is made of electro-caloric material, wherein the temperature drops with $\Delta T$ when the electric field EM is applied to the heat exchanging body BO, it is possible to cool the first object OB1 by applying an electric field to the heat exchanging body BO and thereby lowering the temperature of the heat exchanging body BO. A net amount of heat will be transferred from the first object OB1 to the heat exchanging body BO, thereby lowering the temperature of the first object OB1 and increasing the temperature of the heat exchanging body BO. If no heat sources are present, this situation will eventually lead to a temperature equilibrium between the first object OB1 and the heat exchanging body BO. However, changing the strength of the electric field EM will change the temperature of heat exchanging body BO in a positive or negative direction, thereby allowing for instance to keep the temperature of the first object OB1 constant during a critical time period. The heat exchanging assembly may therefore include a sensor SE that measures the temperature of the first object OB1 and a control unit or controller CU that drives the generator GEN in dependency of signals provided by the sensor SE. When the critical time periods are periodic, the electric field can be removed from the heat exchanging body BO in between the subsequent critical time periods, thereby increasing the temperature of the heat exchanging body BO with $\Delta T$ in this example. The heat exchanging body BO and the first object OB1 are then able to exchange heat with each other and possibly with their surroundings, thereby creating a new temperature equilibrium that can be used as a starting point for the next critical time period. This type of temperature control is especially applicable when the actual temperature is not important, but the variation in temperature over time is, or that only a temperature distribution is important.

It is to be understood by the skilled person that many variations to this example exist and that for instance in a similar manner, the first object OB1 can also be heated by the heat exchanging body BO.

In this embodiment, the first object OB1 also includes heaters HE, which are able to locally heat the first object OB1. The heat exchanging body BO can then for instance be used to globally cool the first object OB1 and the heaters HE can be operated (by the control unit CU) to heat the first object OB1 locally, thereby improving the ability to control the temperature locally, which is advantageously when the temperature distribution is an important parameter.

Figure 3:
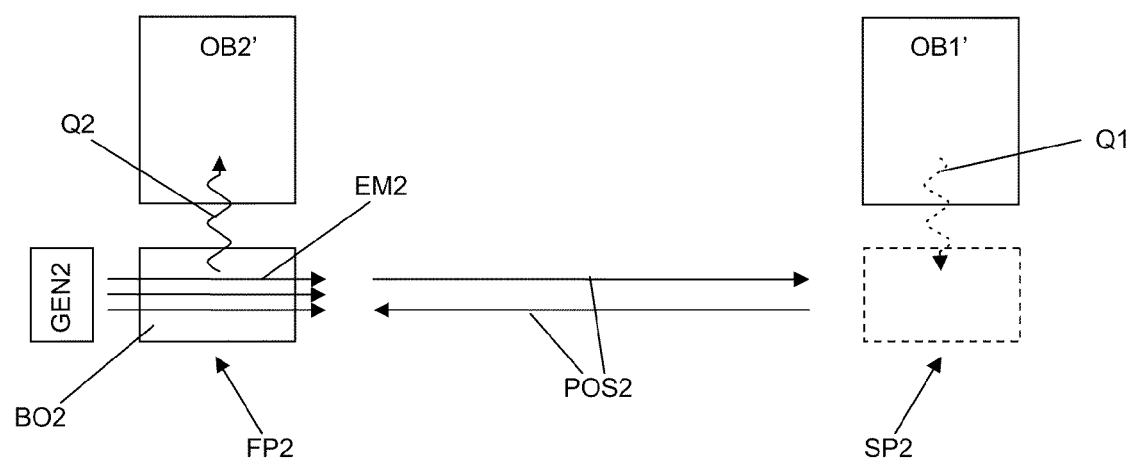
FIG. 3 depicts a schematic representation of a heat exchanging assembly according to another embodiment of the invention.

FIG. 3 depicts a schematic representation of a heat exchanging assembly or heat exchanger according to another embodiment of the invention to exchange heat with a movable first object OB1' and a second object OB2' in order to cool the first object OB1'. The first object OB1' can be any movable object within a lithographic apparatus, such as for instance a substrate table or holder, a support constructed to support a patterning device, a long stroke-module, a short-stroke module, a mechanical part, an electric part, or an optical part. The first object can be a single component, but also an assembly, an element, a member, a system, a part, or portions thereof. The second object OB2' can be any object within a lithographic apparatus, such as for instance a substrate table or holder, a support constructed to support a patterning device, a long stroke-module, a short-stroke module, a frame, a base frame, a metrology frame, a mechanical part, an electric part, or an optical part. The second object can be a single component, but also an assembly, an element, a member, a system, a part, or portions thereof.

The heat exchanging assembly includes a heat exchanging body BO2, which in this embodiment includes a material with magneto-caloric properties. The heat exchanging assembly further includes a generator GEN2, which is configured to supply a magnetic field EM2 to the heat exchanging body BO2.

In this embodiment, the temperature of the heat exchanging body BO2 is increased when the magnetic field EM2 is applied to the heat exchanging body BO2. FIG. 3 shows the situation wherein the magnetic field EM2 is applied to the heat exchanging body BO2 in a first position FP2. Due to the increase in temperature of the heat exchanging body BO2, a net amount of heat will be transferred from the heat exchanging body BO2 to the second object OB2' as indicated by arrow Q2. This will lower the temperature of the heat exchanging body BO2 and increase the temperature of the second object OB2'.

The heat exchanging assembly further includes a positioning system, which is configured to move the heat exchanging body BO2 between the first position FP2 and a second position SP2. The heat exchanging body BO2 is shown in phantom in the second position SP2. The possible movement of the heat exchanging body BO2 caused by the positioning system is schematically indicated by arrows POS2.

When the heat exchanging body BO2 is no longer subjected to the magnetic field EM2 due to the removal of the magnetic field EM2 or movement of the heat exchanging body BO2 out of the field EM2 (or a combination thereof), the temperature of the heat exchanging body BO2 will drop below the temperature of the first object OB1'. When the heat exchanging body BO2 is moved to the second position SP2 by the positioning system, the heat exchanging body BO2 is able to exchange heat with the first object OB1'. Due to the lower temperature of the heat exchanging body BO2, a net amount of heat will be transferred from the first object OB1' to the heat exchanging body BO2 (indicated by arrow Q1), thereby lowering the temperature of the first object OB1' and increasing the temperature of the heat exchanging body BO2. The first object OB1' in this embodiment is thus cooled by the heat exchanging body BO2. In the meantime, the second object OB2' is able to exchange heat with its surroundings thereby lowering its temperature to its initial value. It is also possible that the heat capacity of the second object OB2' is that large that the temperature remains substantially constant throughout the entire process.

After the heat exchange between the heat exchanging body BO2 and the first object OB1', the positioning system will move the heat exchanging body BO2 from the second position SP2 back to the first position FP2, thereby allowing to start the above described cycle all over again.

In this embodiment, heat is exchanged alternately between the heat exchanging body BO2 and the first object OB1' and between the heat exchanging body BO2 and the second object OB2', thereby making this embodiment in particular suitable for cooling of the first object OB1' during a specific time period, for example when the substrate is measured or irradiated by a radiation beam. Temperature control during one or both operations may be important to increase the image quality and overlay performance.

In a variant, the generator GEN2 could provide an electro-magnetic field EM2 in the second position SP2 instead of or in addition to the situation in FIG. 3. The position of the generator GEN2 depends on if cooling or heating of the first object OB1' is desired and on the material properties of the heat exchanging body BO2.

In this embodiment, the first object OB1' is movable relative to the second object OB2'. It is possible that the second position SP2 is stationary with respect to the second object OB2', but it may also be stationary with respect to the first object OB1'. In case of the latter, it is preferred that the first object OB1' is always in the same position with respect to the second object OB2' when the heat exchanging body BO2 is moved from or to the second position SP2. This simplifies the positioning system and the control thereof. In case the first object OB1' is a support structure of a substrate or patterning device, the movement of the heat exchanging body BO2 can be synchronized with the transport of the substrate or patterning to and from the respective support structure, so that the movement of the heat exchanging body BO2 does not require extra time in the overall process it is placed in.

In yet another variant, the first object OB1' may include heaters and a control system may be provided to control the temperature of the first object OB1' similar to the embodiment of FIG. 2. The heat exchanging body BO2 then provides global cooling and the heaters provide local heating, thereby allowing to control the temperature of the first object OB1' or the temperature distribution.

The benefit of the heat exchanging assembly of the embodiment according to FIG. 3 is that no hoses are required between the first object OB1' and the second object OB2' (or another object) to cool and/or heat the first object OB1'. This eliminates the force disturbances due to these hoses and improves the imaging quality and/or overlay performance of a lithographic apparatus, if the system of FIG. 3 is used in such an apparatus.

Figure 4:
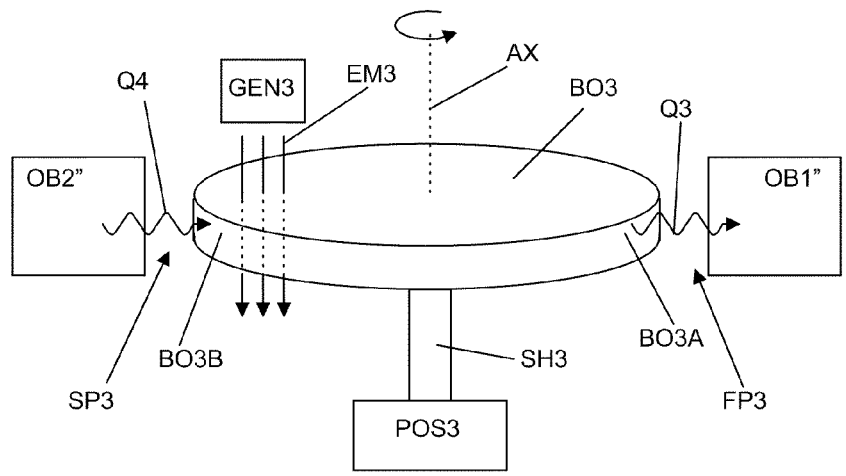
FIG. 4 depicts a schematic representation of a heat exchanging assembly according to yet another embodiment of the invention.

FIG. 4 depicts a schematic representation of a heat exchanging assembly according to yet another embodiment of the invention. The heat exchanging assembly is used to cool or heat a movable first object OB1" by transferring heat from a second object OB2" to the first object OB1". The heat exchanging assembly includes a heat exchanging body BO3, which can be rotated around an axis AX by a positioning system POS3. The positioning system POS3 is connected to the heat exchanging body BO3 by a shaft SH3 that is substantially in line with axis AX. However, a skilled person understands that there exist many other possibilities to rotate heat exchanging body BO3 about the axis AX.

Heat exchanging body BO3 is able to exchange heat with both the first object OB1" and a second object OB2" at the same time. The heat exchange between the heat exchanging body BO3 and the first object OB1" takes place in a first position FP3, and the heat exchange between the heat exchanging body BO3 and the second object OB2" takes place in a second position SP3. In this embodiment, a portion BO3A is positioned in the first position FP3 and at the same time a portion BO3B is positioned in the second portion SP3, so that heat can be exchanged with the first object OB1" and the second object OB2" at the same time.

In this embodiment, the heat exchanging body BO3 includes a magneto-caloric material which shows a temperature drop when subjected to a magnetic field. A magnetic field EM3 can be provided by a generator GEN3. The portion BO3B of heat exchanging body BO3 which is in the second position SP3 is subjected to this magnetic field EM3 resulting in a temperature drop of this portion BO3B, and results in a temperature difference between the second object OB2" and the portion BO3B. As a result of this temperature difference, a net amount of heat (Q4) will be transferred from the second object OB2" to the portion BO3B.

In this example, portion BO3A has just been moved from the second position SP3 to the first position FP3 due to rotation of the heat exchanging body BO3 by the positioning system POS3. Due to this movement, portion BO3A is no longer subjected to the magnetic field EM3 and will thus increase in temperature, resulting in a temperature difference between portion BO3A and the first object OB1", so that a net amount of heat (Q3) can be transferred from the portion BO3A to the first object OB1".

FIG. 4 shows only two portions, but there are more portions possible, preferably evenly spread in tangential direction, so that a continuous rotation of the heat exchanging body BO3 will result in a continuous heat transport from the second object OB2" to the first object OB1" via the heat exchanging body BO3. It is preferred that the heat transport within the heat exchanging body BO3 from one portion to another portion is kept to a minimum by isolating the portions from each other or by rotating the heat exchanging body BO3 fast enough. In case of the latter it is then preferred that the heat transport indicated by arrows Q3 and Q4 is faster than the heat transport inside the heat exchanging body BO3.

The embodiment of FIG. 4 is used to heat the first object OB1". In variants, the material properties of the heat exchanging body BO3 and/or the location of the generator GEN3 may be altered in order to cool the first object OB1" or for design optimization.

The first object OB1" is movable with respect to the second object OB2", but the trajectory along which the first object OB1" is movable may be such that it remains possible for the heat exchanging body BO3 to exchange heat with the first object OB1", for instance, because the trajectory follows the curvature of the heat exchanging body BO3, or that the moving range is small compared to the size of the heat exchanging body BO3. The embodiment of FIG. 4 is also suitable for discontinuous cooling or heating of the first object OB1" as described for the embodiments of FIGS. 2 and 3 by, for example, discontinuous rotation of the heat exchanging body BO3.

Figure 5:
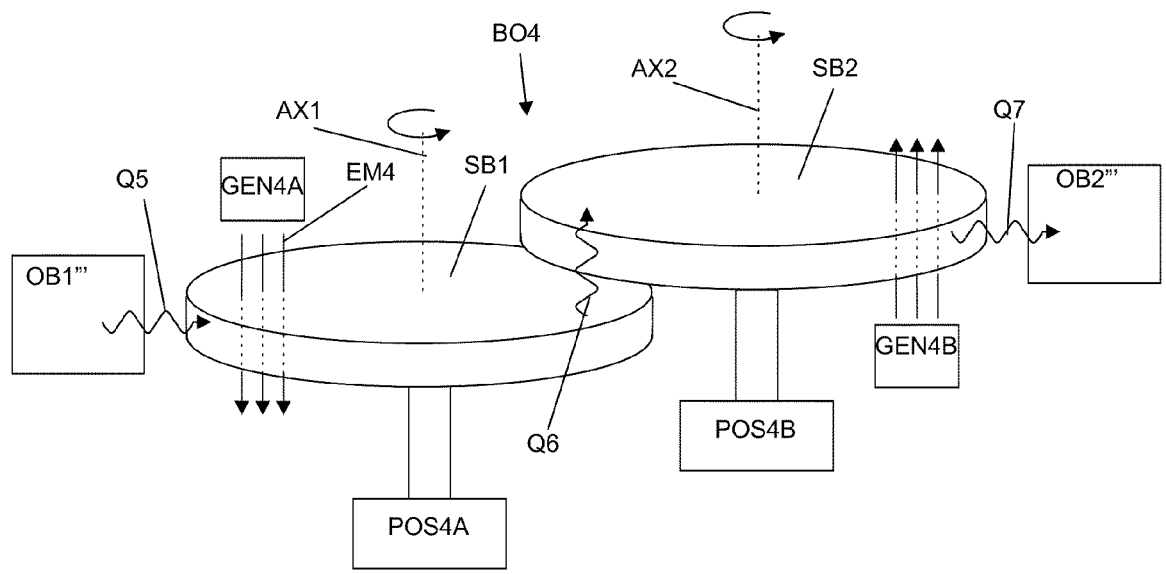
FIG. 5 depicts a schematic representation of a heat exchanging assembly according to a further embodiment of the invention.

FIG. 5 depicts a schematic representation of a heat exchanging assembly according to a further embodiment of the invention, which is configured to cool a first object OB1''' by transferring heat from the first object OB1''' to a second object OB2'''.

The heat exchanging assembly therefore includes a heat exchanging body BO4, which includes a first sub-body SB1 and a second sub-body SB2. The sub-body SB1 includes material with magneto-caloric properties, wherein the temperature drops when the sub-body SB1 is subjected to a magnetic field. The sub-body SB2 includes material with electro-caloric properties, wherein the temperature increases when the sub-body SB2 is subjected to an electric field.

Both sub-bodies SB1, SB2 are rotated about respective axes AX1 and AX2 by corresponding positioning systems POS4A and POS4B similar to the heat exchanging body BO3 in FIG. 4. The working principle of the heat exchanging assembly in this embodiment is also similar to the working principle of the embodiment according to FIG. 4. Heat is transferred from the first object OB1''' to the second object OB2''' via heat exchanging body BO4. In the embodiment of FIG. 5, the heat is transported from the first object OB1''' to the first sub-body SB1 (indicated by arrow Q5), from the first sub-body SB1 to the second sub-body SB2 (indicated by arrow Q6), and from the second sub-body SB2 to the second object OB2''' (indicated by arrow Q7). So, from heat exchange point of view, the first object OB1''', the sub-bodies SB1, SB2, and the second object OB2''' are arranged in series.

Generators GEN4A and GEN4B are configured to apply respective electro-magnetic fields EM4A and EM4B in order to change the temperature of a portion of the respective sub-bodies SB1 and SB2. In this embodiment, heat is transferred using two so-called phases, wherein each sub-body represents a phase. The benefit of using multiple phases instead of one phase, is that a larger temperature difference between the first object OB1''' and the second object OB2''' can be obtained. An additional benefit of this particular embodiment is that due to the choice of material, no electromagnetic field is required at the boundary between the two sub-bodies (that is at the location of heat transfer Q6), thereby reducing the chance of one generator influencing the temperature of the sub-body associated with the other generator.

A person skilled in the art will understand that there exist many variations in the number of sub-bodies, the series and/or parallel arrangement of the sub-body, the choice of material properties, and the location of the generators.

Figure 6:
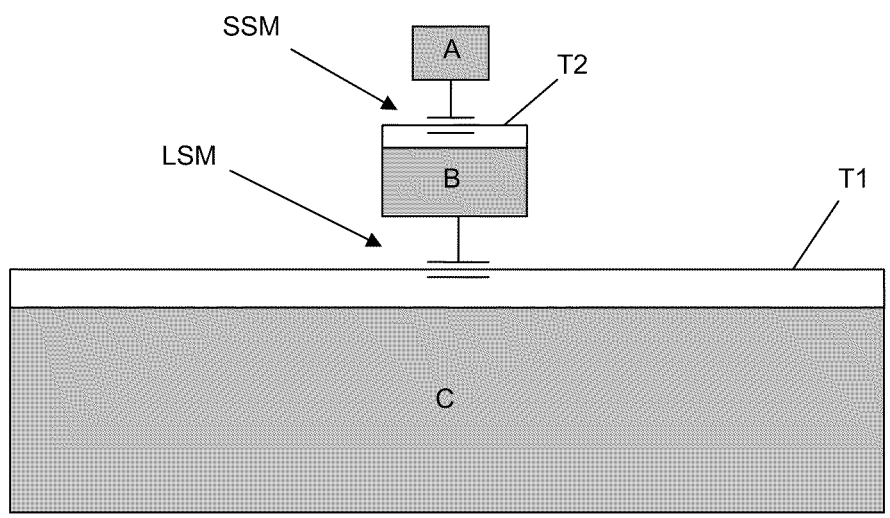
FIG. 6 depicts a schematic representation of a positioning apparatus including a heat exchanging assembly according to an embodiment of the invention.

FIG. 6 schematically represents a positioning apparatus including a heat exchange assembly according to an embodiment of the invention. The positioning apparatus is part of a lithographic apparatus and includes three objects A, B, C, of which object C is considered to be a frame like a metrology frame or a base frame and object A is considered to be a substrate table or substrate holder constructed to hold a substrate (not shown). The position of the substrate that is supported by object A is thus determined by the position of object A.

Object B is movable with respect to the object C along a trajectory T1. Object A is movable with respect to the object B along a trajectory T2, which in this example is shorter than the trajectory T1. The object B can be positioned with respect to object C by a long-stroke module LSM. Object A can be positioned with respect to the object B by a short-stroke module SSM. In general, the long-stroke module LSM provides a coarse positioning of object A through the positioning of object B, and the short-stroke module SSM provides a fine positioning of object A. Both the modules LSM and SSM include actuators, which may be heat sources. Heat sources, such as the actuators of the modules LSM and SSM, may negatively influence the image quality, overlay performance, and/or position accuracy. Temperature control of one or more of the objects may thus be desirable.

The heat exchange assemblies according to FIGS. 2-5 or variants thereof may be used to control the temperature of one of the objects. Objects A and B may correspond to the first object of a heat exchange assembly, and objects B and C may correspond to the second object (if necessary) of the heat exchange assembly. Some variants are shown below:

| Variant: | First object | Second object |
| --- | --- | --- |
| 1 | Object A | — |
| 2 | Object B | — |
| 3 | Object A | Object B |
| 4 | Object A | Object C |
| 5 | Object B | Object C |

The heat exchanging body of the heat exchange assembly may be a separate identity that interacts with the first and second objects, but it can also be part of one of the objects A, B, or C. When the heat exchanging body is able to exchange heat with both the first and second object, the heat exchanging body is preferably supported by the second object.

The benefit of using a heat exchange assembly in a positioning apparatus is that no hoses are required to cool or heat one of the objects A, B, or C. Thereby, force disturbances induced by those hoses are reduced and preferably prevented, leading to improved position accuracy, image quality and/or overlay performance.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a moveable first object; and
   a heat exchanger comprising
      a heat exchanging body comprising a material with electro-caloric or magneto-caloric properties and configured to affect the temperature of the moveable first object by exchanging heat with the moveable first object, the heat exchanging body and the moveable first object being moveable relative to each other, and
      a generator configured to supply an electromagnetic field to the heat exchanging body to change the temperature of the heat exchanging body in order to cool or heat the first object.

2. The lithographic apparatus of claim 1, comprising a second object, wherein the heat exchanging body is configured to exchange heat with the second object.

3. The lithographic apparatus of claim 2, wherein the heat exchanger is configured to alternately exchange heat between the heat exchanging body and the first object and between the heat exchanging body and the second object.

4. The lithographic apparatus of claim 1, wherein the first object comprises a heater configured to locally heat the first object, and wherein the apparatus further comprises a controller configured to control the temperature of the first object with the heat exchanger and the heater of the first object.

5. A lithographic apparatus of claim 1, wherein the first object is one or more or is part of one or more of the following components:
   a substrate table constructed to hold a substrate,
   a support constructed to support a patterning device,
   a long-stroke module, and
   a short-stroke module.

6. A positioning apparatus configured to position a first object with respect to a second object, the apparatus comprising a heat exchanger comprising:
   a heat exchanging body, which comprises a material with electro-caloric or magneto-caloric properties and is configured to exchange heat with the first object and the second object;
   a generator configured to supply an electromagnetic field to the heat exchanging body to change the temperature of the heat exchanging body in order to cool or heat the first object, wherein the heat exchanging body is configured to exchange heat with the first object in a first position, and to exchange heat with the second object in a second position; and
   a positioning system configured to move at least a portion of the heat exchanging body between the first and second position.

7. The positioning apparatus of claim 6, wherein the heat exchanger is configured to alternately exchange heat between the heat exchanging body and the first object and between the heat exchanging body and the second object.

8. The positioning apparatus of claim 6, wherein the heat exchanger is configured to cool the first object by transferring a net amount of heat from the first object to the second object via the heat exchanging body.

9. The positioning apparatus of claim 6, wherein the heat exchanger is configured to heat the first object by transferring a net amount of heat from the second object to the first object via the heat exchanging body.

10. The positioning apparatus of claim 6, wherein the generator is configured to supply an electromagnetic field in the first position, or in the second position, or both in the first and in the second position.

11. The positioning apparatus of claim 6, wherein the positioning system is configured to rotate the heat exchanging body, so that a portion of the heat exchanging body is capable of exchanging heat with the first object and at the same time another portion of the heat exchanging body is capable of exchanging heat with the second object.

12. The positioning apparatus of claim 6, wherein the heat exchanging body comprises a plurality of sub-bodies, wherein each sub-body has a corresponding generator and is configured to exchange heat with at least one other sub-body.

13. The positioning apparatus of claim 6, wherein the first object comprises a heater configured to locally heat the first object, and wherein the apparatus further comprises a controller configured to control the temperature of the first object with the heat exchanging body and the heaters of the first object.

14. The positioning apparatus of claim 6, wherein the first object is one or more or is part of one or more of the following components:
   a substrate table constructed to hold a substrate,
   a support constructed to support a patterning device,
   a long-stroke module, and
   a short-stroke module.

15. The positioning apparatus of claim 6, wherein the second object is one or more or is part of one or more of the following components:
   a substrate table constructed to hold a substrate,
   a support constructed to support a patterning device,
   a long-stroke module,
   a short-stroke module, and
   a frame.

* * * * *